(12) United States Patent
Kamimura

(10) Patent No.: US 11,401,442 B2
(45) Date of Patent: Aug. 2, 2022

(54) POLISHING LIQUID AND CHEMICAL MECHANICAL POLISHING METHOD

(71) Applicant: FUJIFILM Corporation, Tokyo (JP)

(72) Inventor: Tetsuya Kamimura, Shizuoka (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 16/936,526

(22) Filed: Jul. 23, 2020

(65) Prior Publication Data

US 2020/0347268 A1  Nov. 5, 2020

Related U.S. Application Data

(63) Continuation of application No. PCT/JP2019/008700, filed on Mar. 5, 2019.

(30) Foreign Application Priority Data

Mar. 23, 2018  (JP) .............................. JP2018-057125

(51) Int. Cl.
| | | |
|---|---|---|
| C09G 1/02 | (2006.01) | |
| C09G 1/16 | (2006.01) | |
| C09G 1/18 | (2006.01) | |
| H01L 21/306 | (2006.01) | |
| H01L 21/3105 | (2006.01) | |

(52) U.S. Cl.
CPC ............... *C09G 1/02* (2013.01); *C09G 1/16* (2013.01); *C09G 1/18* (2013.01); *H01L 21/30625* (2013.01); *H01L 21/31053* (2013.01)

(58) Field of Classification Search
None
See application file for complete search history.

(56) References Cited

U.S. PATENT DOCUMENTS

| | | |
|---|---|---|
| 2004/0020134 A1 | 2/2004 | Kim et al. |
| 2007/0111433 A1 | 5/2007 | Hirasawa et al. |
| 2007/0298612 A1 | 12/2007 | Dysard et al. |
| 2008/0104893 A1 | 5/2008 | Oh |
| 2008/0120918 A1 | 5/2008 | Hattori et al. |
| 2009/0298290 A1* | 12/2009 | Kamimura ........... C09K 3/1463 438/693 |
| 2010/0099260 A1* | 4/2010 | Matsumoto ....... H01L 21/31053 438/693 |
| 2012/0129346 A1 | 5/2012 | Ryuzaki et al. |
| 2012/0270399 A1* | 10/2012 | Shin .................... C09K 3/1463 438/692 |
| 2015/0376458 A1 | 12/2015 | Grumbine et al. |
| 2017/0298253 A1* | 10/2017 | Ishida ................. H01L 21/3212 |

FOREIGN PATENT DOCUMENTS

| | | | |
|---|---|---|---|
| JP | 2004-511900 A | 4/2004 | |
| JP | 2004-266155 A | 9/2004 | |
| JP | 2007-134598 A | 5/2007 | |
| JP | 2007-180451 A | 7/2007 | |
| JP | 2008-117807 A | 5/2008 | |
| JP | 2008-135452 A | 6/2008 | |
| JP | 2009-540575 A | 11/2009 | |
| JP | 2009-289885 A | 12/2009 | |
| JP | 2016-056292 A | 4/2016 | |
| JP | 2017-525793 A | 9/2017 | |
| JP | 2017-197590 A | 11/2017 | |
| WO | 2011/048889 A1 | 4/2011 | |
| WO | 2016-051659 | * 4/2016 | ............... C09G 1/02 |

OTHER PUBLICATIONS

Communication dated Apr. 27, 2021 from the Japanese Patent Office in Application No. 2020-508159.
International Search Report dated Jun. 4, 2019, issued by the International Searching Authority in application No. PCT/JP2019/008700.
Written Opinion dated Jun. 4, 2019, issued by the International Searching Authority in application No. PCT/JP2019/008700.
International Preliminary Report on Patentability dated Sep. 29, 2020, issued by the International Bureau in application No. PCT/JP2019/008700.
Office Action dated Jul. 13, 2021 by the Japanese Patent Office in Japanese Application No. 2020-508159.

* cited by examiner

*Primary Examiner* — Stephanie P Duclair
(74) *Attorney, Agent, or Firm* — Sughrue Mion, PLLC

(57) ABSTRACT

A polishing liquid is used for chemical mechanical polishing and includes colloidal silica; and an onium salt containing a cation, in which a content of the onium salt is more than 0.01% by mass, a zeta potential of the colloidal silica measured in a state where the colloidal silica is present in the polishing liquid is 15 mV or more, an electrical conductivity is 10 μS/cm or more, and a pH is 2 to 4.

16 Claims, No Drawings

POLISHING LIQUID AND CHEMICAL MECHANICAL POLISHING METHOD

CROSS-REFERENCE TO RELATED APPLICATIONS

This application is a Continuation of PCT International Application No. PCT/JP2019/008700 filed on Mar. 5, 2019, which claims priority under 35 U.S.C. § 119(a) to Japanese Patent Application No. 2018-057125 filed on Mar. 23, 2018. Each of the above application(s) is hereby expressly incorporated by reference, in its entirety, into the present application.

BACKGROUND OF THE INVENTION

1. Field of the Invention

The present invention relates to a polishing liquid and a chemical mechanical polishing method.

2. Description of the Related Art

In manufacturing a semiconductor integrated circuit (large-scale integrated circuit: LSI), a chemical mechanical polishing (CMP) method is used for flattening a bare wafer, flattening an interlayer insulating film, forming a metal plug, forming an embedded wiring, and the like.

Among processes of such LSI manufacturing, use of CMP is expected to increase in Front End of Line (FEOL), which is a pre-process of manufacturing semiconductor integrated circuits. In FEOL, materials forming a film that is a target of CMP are mainly silicon nitride, silicon oxide, and polysilicon. Performing polishing at which a selection ratio of these materials has various requirements depending on usage applications.

For example, JP2009-540575A discloses use of "a polishing composition including (a) 0.01% to 15% by mass of colloidal silica, (b) 10/1,000,000 to 100,000 parts (ppm)/1,000,000 of at least one acidic component having a pKa within a range of 1 to 4.5, and (c) an aqueous carrier therefor" in order to increase a polishing speed for silicon nitride.

SUMMARY OF THE INVENTION

In recent years, depending on usage applications of a polishing target object, there has been a demand for a polishing liquid that increases a polishing speed for silicon oxide with respect to a polishing speed for silicon nitride.

The inventors of the present invention have found that, in a case of using the polishing liquid including colloidal silica as disclosed in JP2009-540575A, there may be a case in which a ratio of a polishing speed for silicon oxide to a polishing speed for silicon nitride is small, and therefore silicon oxide cannot be selectively polished with respect to silicon nitride. In addition, they have also found that many defects (particularly, polishing scratches called scratches) may be generated on a polishing target surface of a polishing target object after polishing.

An object of the present invention is to provide a polishing liquid in which, in a case where the polishing liquid is applied to CMP, selectivity of polishing of silicon oxide with respect to silicon nitride is high, and defects are less likely to be generated on a polishing target surface; and a chemical mechanical polishing method.

The inventors of the present invention have made intensive studies on the above-mentioned object, and as a result, they have found that selectivity of polishing of silicon oxide with respect to silicon nitride is high, and defects are less likely to be generated on a polishing target surface by using a polishing liquid including colloidal silica, and an onium salt containing a cation, in which a content of the onium salt is more than 0.01% by mass, a zeta potential of the colloidal silica measured in a state where the colloidal silica is present in the polishing liquid is 15 mV or more, an electrical conductivity is 10 μS/cm or more, and a pH is 2 to 4. Thereby, the present invention has been completed.

That is, the inventors of the present invention have found that the above-mentioned object can be achieved by the following configuration.

[1] A polishing liquid used for chemical mechanical polishing, the polishing liquid comprising: colloidal silica; and an onium salt containing a cation, in which a content of the onium salt is more than 0.01% by mass, a zeta potential of the colloidal silica measured in a state where the colloidal silica is present in the polishing liquid is 15 mV or more, an electrical conductivity is 10 μS/cm or more, and a pH is 2 to 4.

[2] The polishing liquid according to [1], in which the cation contained in the onium salt has a phosphorus atom or a nitrogen atom as a central atom, and a group containing 2 to 10 carbon atoms, which is bonded to the central atom.

[3] The polishing liquid according to [1] or [2], in which the onium salt includes at least one selected from the group consisting of tetramethylammonium hydroxide, tetraethylammonium hydroxide, tetrapropylammonium hydroxide, tetrabutylammonium hydroxide, tetraoctylammonium hydroxide, and tetrabutylphosphonium hydroxide.

[4] The polishing liquid according to any one of [1] to [3], in which the polishing liquid contains two or more kinds of the onium salts.

[5] The polishing liquid according to any one of [1] to [4], in which a concentration of iron ions is less than 1 ppm by mass.

[6] The polishing liquid according to any one of [1] to [5], further comprising an anionic polymer compound.

[7] The polishing liquid according to [6], in which a weight-average molecular weight of the anionic polymer compound is 2,000 to 50,000.

[8] The polishing liquid according to [6] or [7], in which the anionic polymer compound includes at least one selected from the group consisting of a polyacrylic acid, a polymethacrylic acid, a copolymer containing a polyacrylic acid and a polymethacrylic acid, and a salt thereof.

[9] The polishing liquid according to any one of [1] to [8], in which a degree of association of the colloidal silica is 1 or more.

[10] The polishing liquid according to any one of [1] to [9], in which, in a case where the polishing liquid is used for polishing silicon nitride and silicon oxide, a ratio of a polishing speed for the silicon oxide to a polishing speed for the silicon nitride is 10 or more.

[11] The polishing liquid according to any one of [1] to [10], further comprising a cationic surfactant or an amphoteric surfactant.

[12] The polishing liquid according to [11], in which, in a case where the polishing liquid is used for polishing silicon oxide and polysilicon, a ratio of a polishing speed for the silicon oxide to a polishing speed for the polysilicon is 10 or more.

[13] The polishing liquid according to any one of [1] to [10], further comprising an anionic surfactant.

[14] The polishing liquid according to [13], in which, in a case where the polishing liquid is used for polishing silicon oxide and polysilicon, a ratio of a polishing speed for the silicon oxide to a polishing speed for the polysilicon is 0.25 to 1.5.

[15] A chemical mechanical polishing method comprising bringing a polishing target surface of a polishing target object into contact with a polishing pad while supplying the polishing liquid according to any one of [1] to [14] to the polishing pad attached to a polishing platen, relatively moving the polishing target object and the polishing pad to polish the polishing target surface, and obtaining a polished polishing target object.

[16] The chemical mechanical polishing method according to [15], in which the polishing target object includes silicon nitride and silicon oxide.

[17] The chemical mechanical polishing method according to [16], in which the polishing target object further contains polysilicon.

As will be described hereinafter, according to the present invention, it is possible to provide a polishing liquid in which, in a case where the polishing liquid is applied to CMP, selectivity of polishing of silicon oxide with respect to silicon nitride is high, and defects are less likely to be generated on a polishing target surface; and a chemical mechanical polishing method.

DESCRIPTION OF THE PREFERRED EMBODIMENTS

Hereinafter, the present invention will be described in detail.

The description of constituent elements described below can be made based on representative embodiments of the present invention, but the present invention is not limited to such embodiments.

Numerical value ranges expressed using "to" in the present specification mean a range including numerical values described before and after "to" as the lower limit value and the upper limit value.

Furthermore, in the present specification, the term "ppm" means "parts-per-million ($10^{-6}$)."

Furthermore, in the present specification, 1 Å (angstrom) corresponds to 0.1 nm.

[Polishing Liquid]

A polishing liquid of the embodiment of the present invention (hereinafter, also referred to as a "present polishing liquid") is used for chemical mechanical polishing and includes colloidal silica; and an onium salt containing a cation, in which a content of the onium salt is more than 0.01% by mass, a zeta potential of the colloidal silica measured in a state where the colloidal silica is present in the polishing liquid is 15 mV or more, an electrical conductivity is 10 μS/cm or more, and a pH is 2 to 4.

Regarding the present polishing liquid, selectivity of polishing of silicon oxide (hereinafter, also referred to as "$SiO_2$") with respect to silicon nitride (hereinafter, also referred to as "SiN") is high. Although some parts of details of a reason thereof have not yet been clarified, the reason is presumed as follows.

Polishing of $SiO_2$ easily proceeds in a case where a surface potential of $SiO_2$ is negative. There is a method of making a pH of the polishing liquid acidic (specifically, a pH of 2 to 4) to make a surface potential of $SiO_2$ negative. In other words, in a case where a pH of the polishing liquid is acidic, a surface potential of $SiO_2$ is negative. In addition, a surface potential of SiN tends to be located on a positive side with respect to a surface potential of $SiO_2$.

For this reason, in a case where a zeta potential of colloidal silica is positive (specifically, 10 mV or more), it is presumed that, due to the electrical relationship, the colloidal silica and SiN repel each other and the colloidal silica and $SiO_2$ easily come into contact with each other. It is presumed that, accordingly, polishing of $SiO_2$ proceeds preferentially.

Furthermore, it is considered that use of a polishing liquid having a high electrical conductivity increases a polishing speed for $SiO_2$ because of a reason that the interaction between $SiO_2$ and colloidal silica is improved.

As described above, it is considered that an effect exhibited by using colloidal silica having a positive zeta potential and an effect exhibited by using a polishing liquid having a high electrical conductivity act synergistically, thereby improving selectivity of polishing $SiO_2$ with respect to SiN.

After polishing with the present polishing liquid, defects (particularly scratches) are less likely to be generated on a polishing target surface of a polishing target object. Although some parts of details of a reason thereof have not yet been clarified, the reason is presumed as follows.

In a case where electrical conductivity is improved, there is a tendency for a diffusion layer of colloidal silica (to be described later) to be thin, and the colloidal silica to easily aggregate. Accordingly, it is considered that, by adding a predetermined amount of onium salts, colloidal silica particles are likely to repel each other and the colloidal silica particles are less likely to aggregate, and thereby generation of defects on a polishing target surface due to coarse aggregated particles can be inhibited.

Components contained in the present polishing liquid and components that may be contained therein will be described below.

<Colloidal Silica>

The present polishing liquid includes colloidal silica (silica colloidal particles). The colloidal silica functions as abrasive grains for polishing a polishing target object.

An average primary particle size of the colloidal silica is preferably 100 nm or less and is more preferably 70 nm or less from the viewpoint of further inhibiting generation of defects on a polishing target surface.

The lower limit value of an average primary particle size of the colloidal silica is preferably 10 nm or more, and more preferably 15 nm or more from the viewpoint that then, aggregation of the colloidal silica is inhibited and thereby temporal stability of the present polishing liquid is improved, and a polishing speed for $SiO_2$ is increased and thereby selectivity of polishing $SiO_2$ with respect to SiN is further improved.

An average primary particle size is obtained by measuring particle sizes (equivalent circle diameters) of 1000 primary particles arbitrarily selected from an image captured using a transmission electron microscope TEM2010 (pressurization voltage: 200 kV) manufactured by JEOL Ltd., and arithmetically averaging the values. The equivalent circle diameter is a diameter of a circle assuming a true circle having the same projected area as a projected area of a particle in a case of observation.

However, in a case where a commercially available product is used as colloidal silica, a catalog value is preferentially adopted as an average primary particle size of the colloidal silica.

An average aspect ratio of the colloidal silica is preferably 1.5 to 3.0, more preferably 1.6 to 2.9, and particularly preferably 1.7 to 2.8, from the viewpoint of improving polishing power.

The average aspect ratio of the colloidal silica is obtained by measuring a major axis and a minor axis for every arbitrary 100 particles observed with the above-mentioned transmission electron microscope, calculating aspect ratios (major axis/minor axis) of the respective particles, and arithmetically averaging the aspect ratios of the 100 particles. The major axis of a particle means a length of the particle in a major axis direction, and the minor axis of a particle means a length of the particles in a direction orthogonal to the major axis direction of the particle.

However, in a case where a commercially available product is used as colloidal silica, a catalog value is preferentially adopted as an average aspect ratio of the colloidal silica.

A degree of association of the colloidal silica is preferably 1 or more, and from the viewpoint of further increasing a polishing speed, it is more preferably 1.5 or more and is particularly preferably 2 or more. The upper limit value of the degree of association of the colloidal silica is preferably 3 or less and is more preferably 2.5 or less from the viewpoint of further inhibiting generation of defects on a polishing target surface.

In the present specification, the degree of association is obtained by the equation: degree of association=average secondary particle size/average primary particle size. The average secondary particle size corresponds to an average particle size (equivalent circle diameter) of secondary particles in an aggregated state, and can be obtained by the same method as in the average primary particle size.

However, in a case where a commercially available product is used as colloidal silica, a catalog value is preferentially adopted as a degree of association of the colloidal silica.

As the colloidal silica, a commercially available product may be used, and examples thereof include PL1, PL2, PL3, PL3L, PL3H (all of which are product names, manufactured by FUSO CHEMICAL CO., LTD.), and the like.

The lower limit value of a content of the colloidal silica is preferably 0.1% by mass or more, more preferably 0.5% by mass or more, particularly preferably 1.0% by mass or more, and most preferably 1.5% by mass or more with respect to a total mass (100% by mass) of the present polishing liquid. In a case where a content of the colloidal silica is 0.1% by mass or more, there are advantages such that a polishing speed for $SiO_2$ can be increased, and selectivity of polishing $SiO_2$ with respect to SiN can be further improved.

The upper limit value of a content of the colloidal silica is preferably 10% by mass or less, more preferably 8% by mass or less, even more preferably 5% by mass or less, and particularly preferably 3% by mass or less with respect to a total mass of the present polishing liquid. In a case where a content of colloidal silica is 10% by mass or less, aggregation of the colloidal silica can be inhibited, and therefore, there are advantages such that defects on a polishing target surface can be reduced and temporal stability of the present polishing liquid can be improved.

The colloidal silica may be used alone or in combination of two or more kinds thereof, but it is preferable that one kind be used because then generation of defects on a polishing target surface can be further inhibited.

In a case where two or more kinds of colloidal silica are used in combination, a total content thereof is preferably within the above-mentioned range.

<Onium Salt>

The present polishing liquid includes an onium salt.

A central element of a cation (onium ion) contained in the onium salt is preferably a phosphorus atom or a nitrogen atom.

Among cations contained in the onium salt, examples of cations having a nitrogen atom as a central element include ammonium such as tetramethylammonium, tetraethylammonium, tetrapropylammonium, tetrabutylammonium, tetrapentylammonium, tetraoctylammonium, ethyltrimethylammonium, and diethyldimethylammonium.

Among the cations contained in the onium salt, examples of cations having a phosphorus atom as a central element include phosphonium such as tetramethylphosphonium, tetraethylphosphonium, tetrapropylphosphonium, tetrabutylphosphonium, tetraphenylphosphonium, methyltriphenylphosphonium, ethyltriphenylphosphonium, butyltriphenylphosphonium, benzyltriphenylphosphonium, dimethyldiphenylphosphonium, hydroxymethyltriphenylphosphonium, and hydroxyethyltriphenylphosphonium.

The cations contained in the onium salt preferably have symmetric structures. The phrase "having symmetric structures" means that a molecular structure corresponds to any of point symmetry, line symmetry, and rotational symmetry.

Examples of anions constituting the onium salt include a hydroxide ion, a chlorine ion, a bromine ion, an iodine ion, and a fluorine ion, and a hydroxide ion is more preferable from the viewpoint that generation of defects on a polishing target surface can then be further inhibited.

The onium salt may be ionized in the polishing liquid.

The cation contained in the onium salt particularly preferably has a phosphorus atom or a nitrogen atom as a central atom, and a group containing 2 to 10 carbon atoms (preferably 3 to 8 carbon atoms and more preferably 4 to 8 carbon atoms), which is bonded to the central atom. This makes it possible to further inhibit generation of defects on a polishing target surface.

Specific examples of the group containing 2 to 10 carbon atoms bonded to a central atom include a linear, branched, or cyclic alkyl group, an aryl group which may be substituted by an alkyl group, a benzyl group, an aralkyl group, and the like.

Specific examples of the cation having a phosphorus atom or a nitrogen atom as a central atom and a group containing 2 to 10 carbon atoms, which is bonded to the central atom include tetraethyl ammonium, tetrapropylammonium, tetrabutylammonium, tetrapentylammonium, tetraoctylammonium, tetraethylphosphonium, tetrapropylphosphonium, tetrabutylphosphonium, tetraphenylphosphonium, and the like.

The onium salt preferably contains at least one selected from the group consisting of tetramethylammonium hydroxide, tetraethyl ammonium hydroxide, tetrapropylammonium hydroxide, tetrabutylammonium hydroxide, tetraoctylammonium hydroxide, and tetrabutylphosphonium hydroxide, and more preferably contains tetrabutylammonium hydroxide, from the viewpoint that generation of defects on a polishing target surface can then be further inhibited.

The onium salt particularly preferably contains tetrabutylammonium hydroxide, and tetramethylammonium hydroxide or tetrabutylphosphonium hydroxide because selectivity of polishing $SiO_2$ with respect to SiN is then further improved.

A content of the onium salt is more than 0.01% by mass with respect to a total mass of the present polishing liquid, and it is preferably 0.05% by mass, more preferably 0.1% by mass, and particularly preferably 0.25% by mass, from the viewpoint that then, selectivity of polishing $SiO_2$ with respect to SiN is further improved, defects on a polishing target surface can be more reduced, and temporal stability of the present polishing liquid can be further improved.

The upper limit value of the content of the onium salt is preferably 3% by mass or less, and more preferably 1% by mass or less, with respect to a total mass of the present polishing liquid.

As the onium salt, one kind thereof may be used alone, or two or more kinds thereof may be used in combination. In a case where two or more kinds of onium salts are used in combination, a total content thereof is preferably within the above-mentioned range.

<Anionic Polymer Compound>

The present polishing liquid preferably includes an anionic polymer compound. As a result, the anionic polymer compound is adsorbed on a surface of SiN, which delays polishing of SiN, and thereby selectivity of polishing $SiO_2$ with respect to SiN is further improved. In addition, the effects are exhibited, in which temporal stability of the present polishing liquid is improved and generation of defects on a polishing target surface can be further inhibited.

Examples of anionic polymer compounds include polymers having a monomer having a carboxyl group as a basic constitutional unit, and salts thereof, and copolymers containing these polymers and salts. Specific examples thereof include polyacrylic acid and salts thereof, and copolymers containing them; polymethacrylic acid and salts thereof, and copolymers containing them; polyamic acids and salts thereof, and copolymers containing them; and polycarboxylic acids such as polymaleic acid, polyitaconic acid, polyfumaric acid, poly(p-styrenecarboxylic acid), and polyglyoxylic acid, and salts thereof, and copolymers containing them.

Among the examples, the anionic polymer compound preferably contains at least one selected from the group consisting of polyacrylic acid, polymethacrylic acid, a copolymer containing polyacrylic acid and polymethacrylic acid, and salts thereof.

The anionic polymer compound may be ionized in the polishing liquid.

A weight-average molecular weight of the anionic polymer compound is preferably 1,000 to 100,000, and from the viewpoint of further inhibiting generation of defects on a polishing target surface, it is more preferably 2,000 to 50,000 and is particularly preferably 5,000 to 50,000.

The weight-average molecular weight of the anionic polymer compound is a polystyrene conversion value by gel permeation chromatography (GPC) method. The GPC method is based on a method using HLC-8020GPC (manufactured by TOSOH CORPORATION), using TSKgel SuperHZM-H, TSKgel SuperHZ4000, and TSKgel SuperHZ2000 (manufactured by TOSOH CORPORATION, 4.6 mm ID×15 cm) as columns, and using tetrahydrofuran (THF) as an eluent.

The lower limit value of the content of the anionic polymer compound is preferably 0.01% by mass or more and more preferably 0.1% by mass or more with respect to a total mass of the present polishing liquid, from the viewpoint that then, selectivity of $SiO_2$ polishing with respect to SiN is further improved, and generation of defects on a polishing target surface can be further inhibited.

The upper limit value of the content of the anionic polymer compound is preferably 10% by mass or less, more preferably 5% by mass or less, even more preferably 3% by mass or less, particularly preferably 1% by mass or less, and most preferably 0.3% by mass or less with respect to a total mass of the present polishing liquid, from the viewpoint that temporal stability of the present polishing liquid is then improved.

As the anionic polymer compound, one kind thereof may be used alone, or two or more kinds thereof may be used in combination. In a case where two or more kinds of anionic polymer compounds are used in combination, a total content thereof is preferably within the above-mentioned range.

<Surfactant>

The present polishing liquid includes a cationic surfactant or an amphoteric surfactant as a surfactant, or may include an anionic surfactant.

In a case where the present polishing liquid includes a cationic surfactant or an amphoteric surfactant, selectivity of polishing of $SiO_2$ with respect to polysilicon (polycrystalline silicon, hereinafter, also referred to as "poly-Si") can be increased.

That is, because a surface of poly-Si is hydrophobic, hydrophobic groups of a surfactant is disposed on a surface side of poly-Si, and hydrophilic groups of the surfactant is disposed on a side opposite to the surface side (a position away from the surface of poly-Si). Since a zeta potential of the colloidal silica in the present polishing liquid is positives, it repels the hydrophilic group (cationic group) of the surfactant. It is considered that this decreases a polishing speed for poly-Si. It is considered that as a result, selectivity of polishing of $SiO_2$ with respect to poly-Si is increased.

Specific examples of cationic surfactants include aliphatic amine salts, aliphatic quaternary ammonium salts, benzalkonium chloride salts, benzethonium chloride, pyridinium salts, imidazolinium salts, and the like.

A content of the cationic surfactant is preferably 0.0001% to 1% by mass and is more preferably 0.001% to 0.1% by mass with respect to a total mass of the present polishing liquid.

As the cationic surfactant, one kind thereof may be used alone, or two or more kinds thereof may be used in combination. In a case where two or more kinds of cationic surfactants are used in combination, a total content thereof is preferably within the above-mentioned range.

Specific examples of amphoteric surfactants include carboxybetaine type, aminocarboxylic acid salt, imidazolinium betaine, lecithin, alkylamine oxide, and the like.

A content of the amphoteric surfactant is preferably 0.0001% to 1% by mass and is more preferably 0.001% to 0.1% by mass with respect to a total mass of the present polishing liquid.

As the amphoteric surfactant, one kind thereof may be used alone, or two or more kinds thereof may be used in combination. In a case where two or more kinds of amphoteric surfactants are used in combination, a total content thereof is preferably within the above-mentioned range.

In a case where the present polishing liquid includes an anionic surfactant, a polishing speed for polysilicon (hereinafter, also referred to as "poly-Si") is about the same as a polishing speed for $SiO_2$.

That is, because a surface of poly-Si is hydrophobic, hydrophobic group of a surfactant is disposed on a surface side of poly-Si, and hydrophilic groups of the surfactant is disposed on a side opposite to the surface side (a side away from the surface of poly-Si). Since a zeta potential of the colloidal silica is positive, attraction by hydrophilic groups (anionic groups) of the surfactant easily occurs. It is considered that, as a result, a polishing speed for poly-Si increases, and a polishing speed for poly-Si approaches a polishing speed for $SiO_2$.

Specific examples of anionic surfactants include carboxylic acid salts, sulfonic acid salts such as alkylbenzene sulfonic acid, sulfuric acid ester salts, phosphoric acid ester salts, and the like.

A content of the anionic surfactant is preferably 0.0001% to 1% by mass and is more preferably 0.001% to 0.1% by mass with respect to a total mass of the present polishing liquid.

As the anionic surfactant, one kind thereof may be used alone, or two or more kinds thereof may be used in combination. In a case where two or more kinds of anionic surfactants are used in combination, a total content thereof is preferably within the above-mentioned range.

<Water>

The present polishing liquid preferably includes water. Water contained in the present polishing liquid is not particularly limited, but ion exchange water, pure water, or the like can be used.

A content of water is not particularly limited, but it is preferably 90% to 99% by mass with respect to a total mass of the present polishing liquid.

<Acid Component>

The present polishing liquid preferably includes an acid component. By containing the acid component, a pH of the present polishing liquid can be easily adjusted.

The acid component is not particularly limited, but examples thereof include organic acids and inorganic acids, and inorganic acids are preferable. The acid component may be ionized in the present polishing liquid.

Examples of organic acids include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, hydroxyethyliminodiacetic acid, iminodiacetic acid, and salts thereof such as ammonium salts and/or alkali metal salts.

Examples of inorganic acids include boric acid, nitric acid, sulfuric acid, and phosphoric acid.

A content of the acid component is not particularly limited and may be appropriately set such that a pH is within a desired range.

As the acid component, one kind thereof may be used alone, or two or more kinds thereof may be used in combination.

<Other Components>

The present polishing liquid may include components (other components) other than the components described above, which are used in the polishing liquid for CMP, as long as the effects of the present invention are not impaired.

(Iron Ion)

A concentration of iron ions in the present polishing liquid is preferably less than 1 ppm by mass, more preferably 0.1 ppm by mass or less, and particularly preferably 0.01 ppm by mass or less with respect to a total mass of the present polishing liquid. In a case where a content of iron ions is less than 1 ppm by mass, generation of aggregates based on iron ions can be inhibited, and therefore there are advantages in which generation of defects on a polishing target surface can be further inhibited, and temporal stability of the present polishing liquid is improved.

The lower limit value of the concentration of iron ions in the present polishing liquid is 0 ppm by mass.

A concentration of iron ions in the present polishing liquid can be measured using a device (specifically, Agilent 8900 type (product name, manufactured by Yokogawa Analytical Systems) which has Single Particle-Inductively Coupled Plasma-Mass Spectrometry (SP-ICP-MS) measurement as a measurement principle, and Nexion 350S (product name, manufactured by PerkinElmer, Inc.), or the like.

In the SP-ICP-MS measurement, an amount of metal atoms present in a solution can be measured separately for an ionic metal and a nonionic metal (metal particles). The nonionic metal (metal particles) is a component that does not dissolve in a liquid and exists as a solid, and the ionic metal is a component that dissolves in the liquid.

The concentration of iron ions in the present invention indicates a concentration of ionic metal.

<Physical Properties>

Physical properties of the present polishing liquid will be described below.

(Zeta Potential)

A zeta potential of the colloidal silica measured in a state where the colloidal silica is present in the present polishing liquid is 15 mV or more, is preferably 18 mV or more, and is more preferably 20 mV or more. Accordingly, this improves selectivity of polishing SiN with respect to $SiO_2$.

The upper limit value of the zeta potential of the colloidal silica measured in a state where the colloidal silica is present in the present polishing liquid is preferably 60 mV or less, and is more preferably 40 mV or less. This has the advantage of avoiding a problem that a large amount of particles remain as a residual on a $SiO_2$ substrate.

Examples of methods for setting a zeta potential of colloidal silica measured in a state where the colloidal silica is present in the present polishing liquid within the above range include a method of adjusting a pH of the present polishing liquid, but examples are not limited thereto.

In the present invention, a "zeta potential potential)" means a potential on a "slip plane" of a diffusion electrical double layer present around particles (colloidal silica) in the liquid (present polishing liquid). The "slip plane" is a plane that can be regarded as a hydrodynamic surface of particles in a case where the particles move in a liquid.

The diffusion electrical double layer has a fixing layer formed on a surface side of particles (colloidal silica), and a diffusion layer formed outside the fixing layer. The fixing layer is a layer in which ions are attracted and fixed around particles (colloidal silica) having a charged surface. The diffusion layer is a layer in which ions are freely diffused by thermal motion.

The slip plane is present in a boundary region between the fixing layer and the diffusion layer. In a case where particles are electrophoresed, a migration distance changes depending on potentials (zeta potentials) of the slip plane. Accordingly, a zeta potential of the particles can be measured by electrophoresis.

A zeta potential (mV) of colloidal silica in the present polishing liquid and a thickness (Å) of a diffusion layer can be measured using a zeta potential measuring device DT-1200 (product name, manufactured by Dispersion Technology and sold by Nihon Rufuto Co., Ltd.). A measurement temperature is 25° C.

A thickness of the diffusion layer in the diffusion electrical double layer is preferably 10 to 1,000 Å and is more preferably 50 to 1,000 Å.

In a case where the thickness of the diffusion layer is within the above range, repulsive force between colloidal silica particles can be improved, and thereby aggregation of the colloidal silica particles can be inhibited.

Examples of methods for adjusting the thickness of the diffusion layer within the above range include a method for adjusting electrical conductivity, but examples are not limited thereto.

(Electrical Conductivity)

An electrical conductivity of the present polishing liquid is 10 µS/cm or more, and from the viewpoint of further improving selectivity of polishing $SiO_2$ with respect to SiN, it is preferably 30 µS/cm or more and is more preferably 50 µS/cm or more.

The upper limit value of the electrical conductivity is preferably 3,000 µS/cm or less and is more preferably 2,500 µS/cm or less from the viewpoint of further inhibiting generation of defects on a polishing target surface by inhibiting particle aggregation, and further improving temporal stability of the present polishing liquid.

An electrical conductivity of the present polishing liquid can be measured by an electrical conductivity meter, and a measurement temperature is 25° C. As the electrical conductivity meter, it is possible to use a device conforming to "LAQUA series" (product name, manufactured by HORIBA, Ltd.).

Examples of methods for adjusting an electrical conductivity within the above range include a method for adjusting a content of onium salts, but examples are not limited thereto.

(PH)

A pH of the present polishing liquid is 2 to 4, and it is preferably 2 to 3 and is more preferably 2 to 2.5 from the viewpoint that then, selectivity of polishing $SiO_2$ with respect to SiN is further improved, and generation of defects on a polishing target surface can be further inhibited.

A pH of the present polishing liquid can be measured with a pH meter, and a measurement temperature is 25° C. As the pH meter, it is possible to use "LAQUA series" (product name, manufactured by HORIBA, Ltd.).

Examples of methods of adjusting an pH within the above range include a method of adding an acid component, but examples are not limited thereto.

<Ratio of Polishing Speed>

In a case where the present polishing liquid is used for polishing SiN, $SiO_2$, and derivatives thereof, a ratio of a polishing speed for $SiO_2$ and derivatives thereof to a polishing speed for SiN and derivatives thereof is preferably 10 or more, and more preferably 20 or more. The upper limit value of the ratio of polishing speeds is not particularly limited, but it is preferably 5,000 or less.

A ratio of a polishing speed for $SiO_2$ and derivatives thereof to a polishing speed for SiN and derivatives thereof means a ratio of a polishing speed of $SiO_2$ to a polishing speed of SiN, a ratio of a polishing speed of $SiO_2$ to a polishing speed of derivatives of SiN, a ratio of a polishing speed of derivatives of $SiO_2$ to a polishing speed of SiN, and a ratio of a polishing speed of derivatives of $SiO_2$ to a polishing speed of derivatives of SiN.

Specific examples of derivatives of $SiO_2$ include SiOC, and $SiO_2$ that has been subjected to a doping treatment or the like.

Specific examples of derivatives of SiN include SiON, and SiN that has been subjected to a doping treatment or the like.

In a case where the present polishing liquid includes the above-mentioned cationic surfactant or amphoteric surfactant and the present polishing liquid is used for polishing $SiO_2$, poly-Si, and derivatives thereof, a ratio of a polishing speed of $SiO_2$ and derivatives thereof to a polishing speed of poly-Si and derivatives thereof is preferably 10 or more and is more preferably 15 or more. The upper limit value of the ratio of polishing speeds is not particularly limited, but it is preferably 5,000 or less.

On the other hand, in a case where the present polishing liquid includes the above-mentioned anionic surfactant and the present polishing liquid is used for polishing $SiO_2$, poly-Si, and derivatives thereof, a ratio of a polishing speed of $SiO_2$ and derivatives thereof to a polishing speed of poly-Si and derivatives thereof is preferably 0.25 to 1.5 and is more preferably 0.5 to 1.2.

A ratio of a polishing speed for $SiO_2$, and derivatives thereof to a polishing speed for poly-Si and derivatives thereof means a ratio of a polishing speed of $SiO_2$, to a polishing speed of poly-Si, a ratio of a polishing speed of $SiO_2$, to a polishing speed of derivatives of poly-Si, a ratio of a polishing speed of derivatives of $SiO_2$, to a polishing speed of poly-Si, and a ratio of a polishing speed of derivatives of $SiO_2$, to a polishing speed of derivatives of poly-Si.

Specific examples of derivatives of poly-Si include poly-Si (modified polysilicon) that has been subjected to a doping treatment or the like.

<Method for Producing Present Polishing Liquid>

A method for producing the present polishing liquid is not particularly limited, and a known production method can be used.

For example, each of the above-mentioned components may be mixed to a predetermined concentration to produce the present polishing liquid, or a concentrated liquid may be prepared and then diluted to produce the present polishing liquid.

In addition, in the production of the present polishing liquid, it is preferable to purify any one or more of raw materials for preparing the present polishing liquid by distilling, ion-exchanging, or filtering in advance to reduce a concentration of Fe ions in the liquid. Regarding a degree of purification, for example, raw materials are preferably purified to a purity of 99% or more, and raw materials are more preferably purified to a purity of 99.9% or more.

A purification method is not particularly limited, and examples thereof include a method of passing raw materials through an ion exchange resin, an Reverse Osmosis Membrane (RO membrane), or the like; distillation; or a method such as filtering to be described below. Specific examples thereof include a method of passing raw materials through a reverse osmosis membrane or the like to perform primary purification, and thereafter, passing the raw materials through a purification device formed of a cation exchange resin, an anion exchange resin, or a mixed bed type ion exchange resin to perform secondary purification; and the like.

The purification treatment may be carried out by combining a plurality of the above-described known purification methods.

Furthermore, the purification treatment may be performed multiple times.

A filter can be used without any particular limitation as long as it has been used for filtration usage or the like in the related art. Examples thereof include filters formed of fluororesins such as polytetrafluoroethylene (PTFE) and tetrafluoroethylene perfluoroalkyl vinyl ether copolymer (PFA), polyamide resins such as nylon, polyolefin resins (including those with a high density and a ultra-high molecular weight) such as polyethylene and polypropylene (PP), or the like. Among these materials, materials selected from the group consisting of fluororesins such as polyethylene, polypropylene (including high-density polypropylene), PTFE, and PTA, and polyamide resins such as nylon are preferable. Among them, filters formed of fluororesins such as PTFE and PTA are more preferable. By using a filter formed of these materials, it is possible to effectively remove foreign matter having a high polarity, which is likely to cause defects, and efficiently reduce a concentration of iron ions.

A critical surface tension of the filter is preferably 70 mN/m or more, more preferably 95 mN/m or less, and even more preferably 75 mN/m to 85 mN/m. A value of critical surface tension is a nominal value of manufacturers. By using a filter having a critical surface tension within the above-mentioned range, it is possible to effectively remove foreign matter having a high polarity, which is likely to cause defects, and efficiently reduce a concentration of iron ions.

A pore size of the filter is preferably about 2 to 20 nm and more preferably 2 to 15 nm. In a case where the pore size is within the range, it is possible to reliably remove fine foreign matters such as impurities or aggregates contained in raw materials while inhibiting filter clogging, and it is possible to efficiently reduce a concentration of iron ions.

In a case of using a filter, different filters may be combined. In this case, filtering by a first filter may be performed only once or may be performed two or more times. In a case where different filters are combined to perform filtering two or more times, a pore size of second and subsequent filtering is preferably the same as or smaller than a pore size of first filtering. In addition, first filters having different pore sizes within the above-described range may be combined. A pore size referred to herein can refer to a nominal value of filter manufacturers. Commercially available filters can be selected from, for example, various filters provided by Nippon Pole Co., Ltd., Advantech Toyo Co., Ltd., Japan Entegris Co., Ltd. (formerly Japan Microlith Co., Ltd.), Kits Micro Filter Co., Ltd., and the like. In addition, it is possible to also use a "P-nylon filter (pore size 0.02 critical surface tension 77 mN/m)" which is formed of polyamide (manufactured by Nippon Pole Co., Ltd.); a "PE/clean filter (pore size 0.02 µm)" formed of high-density polyethylene (manufactured by Nippon Pole Co., Ltd.); and a "PE/clean filter (pore size 0.01 µm)" formed of high-density polyethylene (manufactured by Nippon Pole Co., Ltd.).

As a second filter, a filter formed of the same material as the first filter described above can be used. A pore size of the second filter is preferably about 1 to 10 nm.

In addition, in the present invention, a filtering step is preferably performed at room temperature (25° C.) or lower, is more preferably performed at 23° C. or lower, and even more preferably performed at 20° C. or lower. Furthermore, the filtering step is preferably performed at 0° C. or higher, more preferably performed at 5° C. or higher, and even more preferably performed at 10° C. or higher.

In the filtering step, particulate foreign matter or impurities can be removed. In a case of filtering at the above-mentioned temperatures, because an amount of the particulate foreign matter and/or impurities dissolved in raw materials is small, the particulate foreign matter and/or impurities are more efficiently removed by filtering.

In addition, a filter used is preferably treated before filtering raw materials. A liquid used for this treatment is not particularly limited, but it is preferable that a metal content be less than 0.001 ppt by mass. Examples thereof include, in addition to the above-mentioned water, a liquid obtained by purifying other organic solvents to adjust a metal content therein within the above-mentioned range. By pre-treating a filter with a liquid having a metal content reduced as described above, a concentration of iron ions can be efficiently reduced.

[Chemical Mechanical Polishing Method]

A chemical mechanical polishing method of the embodiment of the present invention (hereinafter, also referred to as a "present CMP method") includes a step of bringing a polishing target surface of a polishing target object into contact with a polishing pad while supplying the above-described polishing liquid to the polishing pad attached to a polishing platen, relatively moving the polishing target object and the polishing pad to polish the polishing target surface, and obtaining a polished polishing target object.

<Polishing Target Object>

The polishing target object preferably contains SiN and $SiO_2$, and more preferably further contains poly-Si.

Specific examples of polishing target objects include a substrate, and a laminate having a SiN layer and a $SiO_2$ layer on the substrate. A poly-Si layer may be further disposed on the substrate of the laminate. Each of the layers may be disposed in a thickness direction, or may be disposed in a direction intersecting the thickness direction.

According to the present CMP method, the SiN layer, the $SiO_2$ layer, and the poly-Si layer are polished.

Specific examples of substrates include a single-layered semiconductor substrate and a multi-layered semiconductor substrate.

Specific examples of materials forming the single-layered semiconductor substrate include silicon, silicon germanium, a group III-V compound such as GaAs, or any combination thereof.

Specific example of multi-layered semiconductor substrates include a substrate in which an exposed integrated circuit structure such as interconnect features such as metal wires and dielectric materials is disposed on the above-mentioned semiconductor substrate such as silicon.

<Polishing Device>

A known chemical mechanical polishing device (hereinafter, also referred to as a "CMP device") can be used as a polishing device that can perform the present CMP method.

Examples of CMP devices include a general CMP device having a holder for holding a polishing target object having a polishing target surface, and a polishing platen to which a polishing pad is attached (to which a motor or the like of which a rotation speed can be changed is attached). Examples of commercially available products of the CMP device include Reflexion (manufactured by Applied Materials, Inc.).

<Polishing Pressure>

A polishing pressure in the present CMP method is preferably 3,000 to 25,000 Pa and is more preferably 6,500 to 14,000 Pa. The polishing pressure means a pressure generated on a contact surface between a polishing target surface and a polishing pad.

<Rotation Speed for Polishing Platen>

The rotation speed for a polishing platen in the present CMP method is preferably 50 to 200 rpm and is more preferably 60 to 150 rpm.

In order to relatively move a polishing target object and the polishing pad, the holder may be rotated and/or rocked, the polishing platen may be rotated by planetary rotation, or a belt-shaped polishing pad may be moved linearly in one of longitudinal directions. In addition, the holder may be in any state of being fixed, rotating, or rocked. These polishing methods can be appropriately selected depending on polishing target surfaces and/or polishing devices as long as a polishing target object and the polishing pad are relatively moved.

<Method of Supplying Polishing Liquid>

In the present CMP method, it is preferable to continuously supply the present polishing liquid to the polishing pad on the polishing platen by a pump or the like while polishing a polishing target surface. Although a supply amount of the present polishing liquid is not limited, it is preferable that a surface of the polishing pad be always covered with the present polishing liquid.

EXAMPLES

Hereinafter, the present invention will be described in more detail based on examples. In the following Examples, materials to be used, amounts and ratios thereof, the details of the treatment or the treatment procedures, and the like may be suitably modified without departing from the scope of the present invention. Accordingly, the scope of the present invention should not be limitedly interpreted by the following examples. The symbol "%" means "% by mass" unless otherwise specified.

[Purification of Raw Materials and the Like]

Each raw material used for the preparation of the polishing liquid shown below is a raw material that has been purified using a high-purity grade of a purity of 99% or more, and by distillation, ion-exchange, filtration, or the like in advance. Particularly, a highly pure liquid chemical can be obtained by performing ion-exchange, filtration, or the like on colloidal silica in a solution state before addition.

Specifically, the above-described filtration was performed by the following method as needed. Specifically, continuous filtration was performed using 15 nm IEX PTFE manufactured by Entegris as a first stage and 12 nm ALL PTFE manufactured by Entegris as a second stage as filters (where the number of circulation was adjusted appropriately). Each of the filters was used after being immersed in isopropyl alcohol (IPA) for a hydrophilic treatment before use.

Examples 1A to 46A and Comparative Examples 1A to 41A

Components shown in Table 1 were respectively mixed to prepare polishing liquids of each of Examples and Comparative Examples. An amount of the acid component added was appropriately adjusted and added such that a pH was adjusted to a value shown in Table 1.

The outline of the components shown in Table 1 is shown below.

<Colloidal Silica>

PL1 (product name, manufactured by FUSO CHEMICAL CO., LTD., colloidal silica, average primary particle size: 10 nm, aspect ratios: 1.8, degree of association: 2)

PL2 (product name, manufactured by FUSO CHEMICAL CO., LTD., colloidal silica, average primary particle size: 25 nm, aspect ratios: 1.8, degree of association: 2)

PL3 (product name, manufactured by FUSO CHEMICAL CO., LTD., colloidal silica, average primary particle size: 35 nm, aspect ratios: 1.8, degree of association: 2)

PL3L (product name, manufactured by FUSO CHEMICAL CO., LTD., colloidal silica, average primary particle size: 35 nm, aspect ratio: 1, degree of association: 1)

PL3H (product name, manufactured by FUSO CHEMICAL CO., LTD., colloidal silica, average primary particle size: 35 nm, aspect ratios: 2.6, degree of association: 3)

PL3D (product name, manufactured by FUSO CHEMICAL CO., LTD., colloidal silica having a sulfonic acid group on a surface thereof, average primary particle size: 35 nm, aspect ratios: 1.8, degree of association: 2)

<Onium Salt>

TBAH (tetrabutylammonium hydroxide)
TMAH (tetramethylammonium hydroxide)
TEAH (tetraethylammonium hydroxide)
TPAH (tetrapropylammonium hydroxide)
TOAH (tetraoctylammonium hydroxide)
TBPH (tetrabutylphosphonium hydroxide)

<Anionic Polymer Compound>

PAA (polyacrylic acid)
PMA (polymethacrylic acid)
PAA-PMA (copolymer containing polymethacrylic acid and polymethacrylic acid)

A numerical value in a parentheses in the column of Anionic polymer compound in the table indicates a weight-average molecular weight.

<Acid Component>

Nitric acid
Phosphoric acid
Sulfuric acid
Citric acid
Boric acid

<Surfactant>

DBSA (dodecylbenzene sulfonic acid, anionic surfactant)
Takesurf-A43-N (product name, manufactured by TAKEMOTO OIL & FAT Co., Ltd., anionic surfactant)
Cetyltrimethylammonium chloride (cationic surfactant)
Cetylpyridinium chloride (cationic surfactant)

<Water>

Water (Pure Water)

[Measurement of Physical Properties]

<PH>

A pH of the polishing liquid at 25° C. was measured using a pH meter (product name "LAQUA series," manufactured by HORIBA, Ltd.).

(Zeta Potential)

A zeta potential (mV) of colloidal silica in the polishing liquid was measured using a zeta potential measuring device DT-1200 (product name, manufactured by Dispersion Technology and sold by Nihon Rufuto Co., Ltd.). A temperature of the polishing liquid in a case of measurement was 25° C.

<Electrical Conductivity>

A electrical conductivity (µS/cm) of the polishing liquid at 25° C. was measured using an electrical conductivity meter (product name "LAQUA series," manufactured by HORIBA, Ltd.).

[Measurement of Concentration of Fe Ions]

A concentration of Fe ions in the polishing liquid was measured. Specifically, the measurement was carried out by an SP-ICP-MS method using NexION350S (product name, manufactured by PerkinElmer, Inc.).

Specific measurement conditions by the SP-ICP-MS method are as follows. A detected amount was measured by a peak intensity with respect to a standard liquid of known concentration and was converted into a mass of metal ions, and thereby a concentration of metal ions in the polishing liquid used for the measurement was calculated.

<Measurement Conditions>

Standard substance

Ultrapure water was metered and put into a clean glass container and adjusted such that a concentration of metal ions (Fe ions) to be measured was 1 ppt by mass. Thereafter, a solution treated with an ultrasonic cleaner for 30 minutes was used as a standard substance for measuring transport efficiency.

Device used

Manufacturer: PerkinElmer, Inc.

Model: NexION350S

Measurement method

A PFA coaxial nebulizer, a quartz cyclone spray chamber, and a quartz torch injector having an inner diameter of 1 mm were used to suck the liquid to be measured at about 0.2 ml/min. Cell purging using ammonia gas was performed with an amount of oxygen added of 0.1 L/min and at a plasma output of 1,600 W. Analysis was performed with a time resolution of 50 μs.

Software

A concentration of metal ions (Fe ions) was measured using the following analysis software attached to the manufacturer.

Syngistix nano application module dedicated to "SP-ICP-MS" for nanoparticle analysis

[Evaluation Test]

<Polishing Speed>

Calculation of polishing speed: blanket wafers of SiN, $SiO_2$, and poly-Si were respectively polished for 60 seconds, a film thickness difference between before and after polishing was obtained for 49 evenly-spaced locations on wafer surfaces, and a value obtained by dividing the film thickness difference by the polishing time was defined as a polishing speed (unit: nm/min). Table 1 shows the results.

Polishing device: Reflexion (manufactured by Applied Materials, Inc.)

Polishing pad: IC1010 (manufactured by Rodel)

Polishing conditions:

Polishing pressure (contact pressure between a polishing target surface and a polishing pad): 1.5 psi (in the present specification, psi means pound-force per square inch, and 1 psi=6894.76 Pa)

Supply rate of polishing liquid: 200 ml/min

Rotation speed for polishing platen: 110 rpm

Rotation speed for polishing head: 100 rpm

<Selection Ratio>

From the polishing speed of each of the wafers calculated as described above, a ratio of the polishing speed for $SiO_2$ to the polishing speed for SiN (selection ratio ($SiO_2$/SiN)) and a ratio of the polishing speed for $SiO_2$ to the polishing speed for poly-Si (selection ratio ($SiO_2$/poly-Si)) were respectively obtained.

<Defects>

In the same manner as in the above polishing speed calculation, the blanket wafer of $SiO_2$ which had been polished for 60 seconds was evaluated for defects (scratches) on a polishing target surface thereof by Surfscan SP2 (product name, manufactured by KLA), which is a wafer inspection device.

A: The number of defects after polishing is 20 or less

B: The number of defects after polishing is 21 to 30

C: The number of defects after polishing is 31 to 50

D: The number of defects after polishing is 51 to 60

E: The number of defects after polishing is 61 to 80

F: The number of defects after polishing is 81 or more

<Temporal Stability>

Each of the polishing liquids was stored at 40° C. for 30 days. Using a particle size distribution analyzer SALD-2300 (manufactured by Shimadzu Corporation), particle size distribution of each of colloidal silica immediately after preparation (initial colloidal silica) and colloidal silica after storage was measured to obtain respective average particle sizes (a value of 50% diameter obtained by calculating a volume average: D50), and temporal stability of the polishing liquid was evaluated by a ratio calculated from the following formula.

$$T3 = \text{(average particle size of colloidal silica after storage)}/\text{(average particle size of initial colloidal silica)}$$

A: T3 is 1.1 or less

B: T3 is more than 1.1 and 1.3 or less

C: T3 is more than 1.3 and 1.5 or less

D: T3 is more than 1.5 and 1.8 or less

E: T3 is more than 1.8 and 2.0 or less

F: T3 is more than 2.0

Table 1 shows values of each of the physical properties measured as described above and the results of each of the evaluation tests. In the table, "A<" (where A represents a numerical value) means that a value is larger than A, and "<A" means that a value is smaller than A.

TABLE 1

| | Composition of polishing liquid | | | | | | | | | | |
|---|---|---|---|---|---|---|---|---|---|---|---|
| | Colloidal silica | | | Onium salt | | Anionic polymer compound | | Acid component | | Other additives | | Water |
| | Type | Content | Degree of association | Type | Content | Type | Content | Type | Content | Type | Content | Content |
| Example 1A | PL3 | 1.5% | 2 | TBAH | 0.25% | PAA (25000) | 0.1% | Nitric acid | Amount that can adjust pH | — | — | Residue |
| Example 2A | PL3 | 1.5% | 2 | TBAH | 0.25% | PAA (25000) | 0.1% | Nitric acid | Amount that can adjust pH | — | — | Residue |
| Example 3A | PL3 | 1.5% | 2 | TBAH | 0.25% | PAA (25000) | 0.1% | Nitric acid | Amount that can adjust pH | — | — | Residue |
| Example 4A | PL3 | 1.5% | 2 | TBAH | 0.25% | PAA (25000) | 0.1% | Nitric acid | Amount that can adjust pH | — | — | Residue |
| Example 5A | PL3 | 1.5% | 2 | TBAH | 0.25% | PAA (25000) | 0.1% | Nitric acid | Amount that can adjust pH | — | — | Residue |
| Example 6A | PL1 | 1.5% | 2 | TBAH | 0.25% | PAA (25000) | 0.1% | Nitric acid | Amount that can adjust pH | — | — | Residue |
| Example 7A | PL2 | 1.5% | 2 | TBAH | 0.25% | PAA (25000) | 0.1% | Nitric acid | Amount that can adjust pH | — | — | Residue |
| Example 8A | PL3L | 1.5% | 1 | TBAH | 0.25% | PAA (25000) | 0.1% | Nitric acid | Amount that can adjust pH | — | — | Residue |
| Example 9A | PL3H | 1.5% | 3 | TBAH | 0.25% | PAA (25000) | 0.1% | Nitric acid | Amount that can adjust pH | — | — | Residue |
| Example 10A | PL3 | 1.0% | 2 | TBAH | 0.25% | PAA (25000) | 0.1% | Nitric acid | Amount that can adjust pH | — | — | Residue |
| Example 11A | PL3 | 2.0% | 2 | TBAH | 0.25% | PAA (25000) | 0.1% | Nitric acid | Amount that can adjust pH | — | — | Residue |
| Example 12A | PL3 | 3.0% | 2 | TBAH | 0.25% | PAA (25000) | 0.1% | Nitric acid | Amount that can adjust pH | — | — | Residue |
| Example 13A | PL3 | 5.0% | 2 | TBAH | 0.25% | PAA (25000) | 0.1% | Nitric acid | Amount that can adjust pH | — | — | Residue |
| Example 14A | PL3 | 1.5% | 2 | TBAH | 0.05% | PAA (25000) | 0.1% | Nitric acid | Amount that can adjust pH | — | — | Residue |

TABLE 1-continued

| | | | | | | | | |
|---|---|---|---|---|---|---|---|---|
| 15A | | | | | | acid | that can adjust pH | |
| Example 16A | PL3 | 1.5% | 2 | TBAH | 0.5% | PAA (25000) | 0.1% | Nitric acid | Amount that can adjust pH | — | Residue |
| Example 17A | PL3 | 1.5% | 2 | TBAH | 1% | PAA (25000) | 0.1% | Nitric acid | Amount that can adjust pH | — | Residue |
| Example 18A | PL3 | 1.5% | 2 | TMAH | 0.09% | PAA (25000) | 0.1% | Nitric acid | Amount that can adjust pH | — | Residue |
| Example 19A | PL3 | 1.5% | 2 | TEAH | 0.14% | PAA (25000) | 0.1% | Nitric acid | Amount that can adjust pH | — | Residue |
| Example 20A | PL3 | 1.5% | 2 | TPAH | 0.20% | PAA (25000) | 0.1% | Nitric acid | Amount that can adjust pH | — | Residue |
| Example 21A | PL3 | 1.5% | 2 | TOAH | 0.45% | PAA (25000) | 0.1% | Nitric acid | Amount that can adjust pH | — | Residue |
| Example 22A | PL3 | 1.5% | 2 | TBPH | 0.27% | PAA (25000) | 0.1% | Nitric acid | Amount that can adjust pH | — | Residue |
| Example 23A | PL3 | 1.5% | 2 | TBAH TMAH | 0.25% 0.09% | PAA (25000) | 0.1% | Nitric acid | Amount that can adjust pH | — | Residue |
| Example 24A | PL3 | 1.5% | 2 | TBAH TBPH | 0.25% 0.27% | PAA (25000) | 0.1% | Nitric acid | Amount that can adjust pH | — | Residue |
| Example 25A | PL3/PL3H (mass ratio: 5/5) | 1.5% | 2.5 | TBAH | 0.25% | PAA (25000) | 0.1% | Nitric acid | Amount that can adjust pH | — | Residue |
| Example 26A | PL3/PL3L (mass ratio: 5/5) | 1.5% | 1.5 | TBAH | 0.25% | PAA (25000) | 0.1% | Nitric acid | Amount that can adjust pH | — | Residue |
| Example 27A | PL3/PL2 (mass ratio: 5/5) | 1.5% | 2 | TBAH | 0.25% | PAA (25000) | 0.1% | Nitric acid | Amount that can adjust pH | — | Residue |
| Example 28A | PL3/PL1 (mass ratio: 5/5) | 1.5% | 2 | TBAH | 0.25% | PAA (25000) | 0.1% | Nitric acid | Amount that can adjust pH | — | Residue |
| Example 29A | PL2/PL1 (mass ratio: 5/5) | 1.5% | 2 | TBAH | 0.25% | PAA (25000) | 0.1% | Nitric acid | Amount that can adjust pH | — | Residue |
| Example 30A | PL3 | 1.5% | 2 | TBAH | 0.25% | PAA-PMA (25000) | 0.1% | Nitric acid | Amount that can adjust pH | — | Residue |
| Example 31A | PL3 | 1.5% | 2 | TBAH | 0.25% | PMA (25000) | 0.1% | Nitric acid | Amount that can adjust pH | — | Residue |
| Example 32A | PL3 | 1.5% | 2 | TBAH | 0.25% | | | Nitric acid | Amount that can adjust pH | — | Residue |

TABLE 1-continued

| Example | | | | | | | | | | | | |
|---|---|---|---|---|---|---|---|---|---|---|---|---|
| Example 33A | PL3 | 1.5% | 2 | TBAH | 0.25% | PAA (25000) | 0.3% | Nitric acid | Amount that can adjust pH | — | — | Residue |
| Example 34A | PL3 | 1.5% | 2 | TBAH | 0.25% | PAA (25000) | 1% | Nitric acid | Amount that can adjust pH | — | — | Residue |
| Example 35A | PL3 | 1.5% | 2 | TBAH | 0.25% | PAA (1000) | 0.1% | Nitric acid | Amount that can adjust pH | — | — | Residue |
| Example 36A | PL3 | 1.5% | 2 | TBAH | 0.25% | PAA (5000) | 0.1% | Nitric acid | Amount that can adjust pH | — | — | Residue |
| Example 37A | PL3 | 1.5% | 2 | TBAH | 0.25% | PAA (50000) | 0.1% | Nitric acid | Amount that can adjust pH | — | — | Residue |
| Example 38A | PL3 | 1.5% | 2 | TBAH | 0.25% | PAA (100000) | 0.1% | Nitric acid | Amount that can adjust pH | — | — | Residue |
| Example 39A | PL3 | 1.5% | 2 | TBAH | 0.25% | PAA (25000) | 0.1% | Boric acid | Amount that can adjust pH 0.3% | — | — | Residue |
| Example 40A | PL3 | 1.5% | 2 | TBAH | 0.25% | PAA (25000) | 0.1% | Phosphoric acid | Amount that can adjust pH | — | — | Residue |
| Example 41A | PL3 | 1.5% | 2 | TBAH | 0.25% | PAA (25000) | 0.1% | Sulfuric acid | Amount that can adjust pH | — | — | Residue |
| Example 42A | PL3 | 1.5% | 2 | TBAH | 0.25% | PAA (25000) | 0.1% | Citric acid | Amount that can adjust pH | — | — | Residue |
| Example 43A | PL3 | 1.5% | 2 | TBAH | 0.25% | PAA (25000) | 0.1% | Nitric acid | Amount that can adjust pH | DBSA | 0.01% | Residue |
| Example 44A | PL3 | 1.5% | 2 | TBAH | 0.25% | PAA (25000) | 0.1% | Nitric acid | Amount that can adjust pH | Takesurf-A43-N | 0.01% | Residue |
| Example 45A | PL3 | 1.5% | 2 | TBAH | 0.25% | PAA (25000) | 0.1% | Nitric acid | Amount that can adjust pH | Cetyltrimethylammonium chloride | 0.01% | Residue |
| Example 46A | PL3 | 1.5% | 2 | TBAH | 0.25% | PAA (25000) | 0.1% | Nitric acid | Amount that can adjust pH | Cetylpyridinium chloride | 0.01% | Residue |
| Comparative Example 1A | PL3 | 1.5% | 2 | TBAH | 0.01% | PAA (25000) | 0.1% | Phosphoric acid | Amount that can adjust pH | — | — | Residue |
| Comparative Example 2A | PL3D | 1.5% | 2 | — | — | PAA (25000) | 0.1% | Phosphoric acid | Amount that can adjust pH | — | — | Residue |
| Comparative Example 3A | PL3 | 1.5% | 2 | TBAH | 0.25% | PAA (25000) | 0.1% | Phosphoric acid | Amount that can adjust pH | — | — | Residue |

TABLE 1-continued

| | PL3 | TBAH | PAA (25000) | Phosphoric acid | | | Physical properties | | | | Polishing speed for SiO₂ (nm/min) | Polishing speed for SiN (nm/min) | Polishing speed for poly-Si (nm/min) | Selection ratio SiO₂/SiN | Selection ratio SiO₂/poly-Si | Amount that can adjust pH | Evaluation results | | Residue |
|---|---|---|---|---|---|---|---|---|---|---|---|---|---|---|---|---|---|---|---|
| | | | | | | | Electrical conductivity (μS/cm) | Zeta potential (mV) | pH | Concentration of Fe ions (ppm) | | | | | | | Defect | Temporal stability | |
| Comparative Example 4A | 1.5% | 2 | 0.25% | 0.1% | | | | | | | | | | | | — | | | — |
| Example 1A | | | | | | | >500 | 32 | 2 | 0.002 | 328 | 5 | — | 65.6 | — | — | A | A | |
| Example 2A | | | | | | | >500 | 28 | 2.5 | 0.003 | 348 | 3 | 153 | 116.0 | 2.3 | — | A | A | |
| Example 3A | | | | | | | >500 | 25 | 3 | 0.002 | 318 | 3 | — | 106.0 | — | — | A | A | |
| Example 4A | | | | | | | >500 | 16 | 4 | 0.003 | 298 | 2 | — | 149.0 | — | — | B | A | |
| Example 5A | | | | | | | >500 | 28 | 2.5 | 1 | 258 | 8 | 153 | 32.3 | 1.7 | — | C | B | |
| Example 6A | | | | | | | >500 | 28 | 2.5 | 3 | 212 | 3 | 153 | 70.7 | 1.4 | — | D | C | |
| Example 7A | | | | | | | >500 | 21 | 2.5 | 0.002 | 252 | 3 | — | 84.0 | — | — | A | A | |
| Example 8A | | | | | | | >500 | 24 | 2.5 | 0.004 | 282 | 3 | — | 94.0 | — | — | A | A | |
| Example 9A | | | | | | | >500 | 28 | 2.5 | 0.002 | 302 | 3 | — | 100.7 | — | — | A | A | |
| Example 10A | | | | | | | >500 | 28 | 2.5 | 0.003 | 428 | 6 | — | 71.3 | — | — | C | A | |
| Example 11A | | | | | | | >500 | 30 | 2.5 | 0.002 | 281 | 3 | — | 93.7 | — | — | A | A | |
| Example 12A | | | | | | | >500 | 26 | 2.5 | 0.004 | 365 | 4 | — | 91.3 | — | — | A | A | |
| Example 13A | | | | | | | >500 | 21 | 2.5 | 0.003 | 452 | 5 | — | 90.4 | — | — | A | A | |
| Example 14A | | | | | | | >500 | 18 | 2.5 | 0.003 | 563 | 8 | — | 70.4 | — | — | A | A | |
| Example 15A | | | | | | | >100 | 24 | 2.5 | 0.002 | 291 | 4 | — | 72.8 | — | — | B | C | |
| Example 16A | | | | | | | >500 | 28 | 2.5 | 0.002 | 392 | 3 | — | 130.7 | — | — | A | A | |
| Example 17A | | | | | | | >1500 | 35 | 2.5 | 0.003 | 351 | 2 | — | 175.5 | — | — | A | A | |
| Example 18A | | | | | | | >500 | 16 | 2.5 | 0.002 | 213 | 6 | — | 35.5 | — | — | B | B | |
| Example 19A | | | | | | | >500 | 18 | 2.5 | 0.003 | 243 | 5 | — | 48.6 | — | — | B | B | |
| Example 20A | | | | | | | >500 | 20 | 2.5 | 0.003 | 256 | 4 | — | 64.0 | — | — | B | B | |
| Example 21A | | | | | | | >500 | 20 | 2.5 | 0.004 | 283 | 4 | — | 70.8 | — | — | B | B | |

TABLE 1-continued

| | | | | | | | | | | | |
|---|---|---|---|---|---|---|---|---|---|---|---|
| Example 21A | >500 | 29 | 2.5 | 0.004 | 328 | 3 | — | 109.3 | — | A | A |
| Example 22A | >500 | 36 | 2.5 | 0.005 | 389 | 2 | 189 | 194.5 | 2.1 | A | A |
| Example 23A | >500 | 48 | 2.5 | 0.006 | 456 | 1 | 253 | 456.0 | 1.8 | A | A |
| Example 24A | >500 | 26 | 2.5 | 0.015 | 389 | 4 | — | 97.3 | — | B | A |
| Example 25A | >500 | 26 | 2.5 | 0.032 | 315 | 5 | — | 63.0 | — | B | A |
| Example 26A | >500 | 25 | 2.5 | 0.420 | 298 | 4 | — | 74.5 | — | B | A |
| Example 27A | >500 | 22 | 2.5 | 0.053 | 274 | 3 | — | 91.3 | — | B | A |
| Example 28A | >500 | 20 | 2.5 | 0.068 | 265 | 2 | — | 132.5 | — | B | A |
| Example 29A | >500 | 29 | 2.5 | 0.002 | 348 | 2 | — | 174.0 | — | A | A |
| Example 30A | >500 | 29 | 2.5 | 0.003 | 351 | 3 | — | 117.0 | — | A | A |
| Example 31A | >500 | 29 | 2.5 | 0.002 | 365 | 32 | — | 11.4 | — | C | C |
| Example 32A | >500 | 29 | 2.5 | 0.002 | 340 | 2 | — | 170.0 | — | A | A |
| Example 33A | >500 | 29 | 2.5 | 0.004 | 338 | 1 | — | 338.0 | — | A | B |
| Example 34A | >500 | 29 | 2.5 | 0.003 | 362 | 26 | — | 13.9 | — | B | A |
| Example 35A | >500 | 29 | 2.5 | 0.002 | 341 | 8 | — | 42.6 | — | A | A |
| Example 36A | >500 | 29 | 2.5 | 0.003 | 353 | 5 | — | 70.6 | — | A | A |
| Example 37A | >500 | 29 | 2.5 | 0.002 | 349 | 4 | — | 87.3 | — | C | C |
| Example 38A | >500 | 29 | 2.5 | 0.002 | 521 | 3 | — | 173.7 | — | A | A |
| Example 39A | >500 | 29 | 2.5 | 0.003 | 352 | 3 | — | 117.3 | — | A | A |
| Example 40A | >500 | 26 | 2.5 | 0.002 | 342 | 2 | — | 171.0 | — | A | A |
| Example 41A | >500 | 27 | 2.5 | 0.003 | 328 | 3 | — | 109.3 | — | A | A |
| Example 42A | >500 | 28 | 2.5 | 0.002 | 336 | 3 | 456 | 112.0 | 0.7 | A | A |
| Example 43A | >500 | 27 | 2.5 | 0.002 | 385 | 2 | 289 | 192.5 | 1.3 | A | A |
| Example 44A | >500 | 26 | 2.5 | 0.004 | 351 | 3 | 8 | 117.0 | 43.9 | A | A |
| Example 45A | >500 | 27 | 2.5 | 0.003 | 341 | 3 | 9 | 113.7 | 37.9 | A | A |
| Comparative Example 1A | <10 | 12 | 2.5 | 0.005 | 198 | 265 | 42 | 0.75 | 4.71 | F | F |

TABLE 1-continued

| | | | | | | | | | | |
|---|---|---|---|---|---|---|---|---|---|---|
| Comparative Example 2A | <10 | −20 | 2.5 | 0.030 | 52 | 153 | 58 | 0.34 | 0.90 | C | B |
| Comparative Example 3A | >500 | 32 | 1.5 | 0.008 | 412 | 32 | 125 | 12.88 | 3.30 | F | B |
| Comparative Example 4A | >500 | 4 | 6 | 0.006 | 123 | 32 | 125 | 3.84 | 0.98 | F | F |

As shown in Table 1, it was shown that selectivity of polishing SiO$_2$ with respect to SiN was high, defects were less likely to be generated on a polishing target surface, and temporal stability of the polishing liquid was also excellent in a case of using the polishing liquid in which a content of onium salts was more than 0.01% by mass, the zeta potential of the colloidal silica measured in the state where the colloidal silica was present in the polishing liquid was 15 mV or more, the electrical conductivity was 10 μS/cm or more, and the pH was 2 to 4.

Based on the comparison of Examples 1A to 4A, it was shown that defects on a polishing target surface were more reduced in a case where the pH of the polishing liquid was within the range of 2 to 3 (Examples 1A to 3A).

Based on the comparison between Example 2A and Examples 5A and 6A, it was shown that selectivity of polishing SiO$_2$ with respect to SiN was higher, defects on a polishing target surface was more reduced, and temporal stability of the polishing liquid was further improved in a case where a concentration of iron ions in the polishing liquid was less than 1 ppm by mass (Example 2A).

Based on the comparison of Examples 2A, 7A, and 8A, it was shown that selectivity of polishing SiO$_2$ with respect to SiN was high, and defects were unlikely to be generated on a polishing target surface in a case where colloidal silica having an average primary particle size of 15 nm or more was used (Examples 2A and 8A).

Based on the comparison between Examples 2A, 9A, and 10A, it was shown that both selectivity of polishing SiO$_2$ with respect to SiN, and inhibition of defects on a polishing target surface could be achieved at high levels in a case where colloidal silica having a degree of association of 1.5 to 2.5 was used (Example 2A).

Based on the comparison between Example 2A and Examples 11A to 14A, it was shown that selectivity of polishing SiO$_2$ with respect to SiN was higher in a case where a content of colloidal silica was 1% to 3% by mass (Example 2A and Examples 11A to 13A).

Based on the comparison of Examples 2A and 15A to 17A, it was shown that selectivity of polishing SiO$_2$ with respect to SiN was more improved, defects on a polishing target surface could be more reduced, and temporal stability of the present polishing liquid could be more improved in a case where a content of onium salts was more within the range of 0.1% to 3% by mass (Examples 2A, 16A, and 17A).

Based on the comparison of Examples 2A and 18A to 22A, it was shown that selectivity of polishing SiO$_2$ with respect to SiN was higher in a case where a cation constituting onium salts had a phosphorus atom or a nitrogen atom as a central atom and a group containing 2 to 10 carbon atoms, which is bonded to the central atom (Examples 2A and 19A to 22A).

Based on the comparison between Example 2A and Examples 23A and 24A, it was shown that selectivity of polishing SiO$_2$ with respect to SiN was higher in a case where tetrabutylammonium hydroxide was used in combination with tetramethylammonium hydroxide or tetrabutylphosphonium hydroxide (Examples 23A and 24A).

Based on the comparison between Example 2A and Examples 25A to 29A, it was shown that defects was less likely to be generated on a polishing target surface in a case where one kind of colloidal silica was used alone (Example 2A).

Based on the comparison between Example 2A and Examples 30A to 32A, selectivity of polishing SiO$_2$ with respect to SiN was higher, defects on a polishing target surface was less likely to be generated on a polishing target surface, and temporal stability of the polishing liquid was further excellent in a case where an anionic polymer compound was used (Examples 2A, 30A, and 31A).

Based on the comparison of Examples 2A, 33A, and 34A, it was shown that temporal stability of the polishing liquid was further excellent in a case where a content of the anionic polymer compound was 0.3% by mass or less (Examples 2A and 33A).

Based on the comparison of Examples 2A and 35A to 38A, it was shown that defects were less likely to be generated on a polishing target surface in a case where a weight-average molecular weight of the anionic polymer compound was within the range of 2,000 to 50,000 (Examples 2A, 36A, and 37A).

Based on the comparison of Examples 2A and 39A to 42A, it was shown that selectivity of polishing SiO$_2$ with respect to SiN was higher in a case of using inorganic acids (Examples 2A and 39A to 41A).

Based on the comparison between Example 2A and Examples 43A and 44A, it was shown that a polishing speed for poly-Si and a polishing speed for SiO$_2$ were about the same as each other in a case of using anionic surfactants (Examples 43A and 44A).

Based on the comparison between Example 2A and Examples 45A and 46A, it was shown that selectivity of SiO$_2$ with respect to poly-Si was increased in a case of using a cationic surfactant (Examples 45A and 46A).

On the other hand, it was shown that selectivity of polishing SiO$_2$ with respect to SiN deteriorated, many defects were generated on a polishing target surface, and temporal stability of the polishing liquid deteriorated in a case of using the polishing liquid in which a content of onium salts was 0.01% by mass or less (Comparative Example 1A).

Furthermore, it was also shown that selectivity of polishing SiO$_2$ with respect to SiN was lower in a case of using a polishing liquid in which an electrical conductivity was less than 10 μS/cm and a zeta potential was less than 15 mV (Comparative Example 2A).

Furthermore, it was also shown that many defects were generated on a polishing target surface in a case of using a polishing liquid in which a pH was less than 2 (Comparative Example 3A).

Furthermore, it was shown that in selectivity of polishing SiO$_2$ with respect to SiN was lower, and many defects were generated on a polishing target surface in a case of using a polishing liquid in which a pH was more than 4 (Comparative Example 4A).

What is claimed is:

1. A polishing liquid used for chemical mechanical polishing, the polishing liquid comprising:
    colloidal silica wherein a degree of associated of the colloidal silica is 1 or more and 3 or less,
    an onium salt containing a cation,
    wherein the onium salt includes at least one selected from the group consisting of tetramethylammonium hydroxide, tetraethylammonium hydroxide, tetrapropylammonium hydroxide, tetrabutylammonium hydroxide, tetraoctylammonium hydroxide, and tetrabutylphosphonium hydroxide,
    a content of the onium salt is 0.05 to 1% by mass with respect to a total mass of the polishing liquid,
    a zeta potential of the colloidal silica measured in a state where the colloidal silica is present in the polishing liquid is 15 mV or more,
    an electrical conductivity is 10 μS/cm or more, and
    a pH is 2 to 4.

2. The polishing liquid according to claim 1, wherein the polishing liquid contains two or more kinds of the onium salts.

3. The polishing liquid according to claim 1, wherein a concentration of iron ions is less than 1 ppm by mass.

4. The polishing liquid according to claim 1, further comprising an anionic polymer compound.

5. The polishing liquid according to claim 4, wherein a weight-average molecular weight of the anionic polymer compound is 2,000 to 50,000.

6. The polishing liquid according to claim 4, wherein the anionic polymer compound includes at least one selected from the group consisting of a polyacrylic acid, a polymethacrylic acid, a copolymer containing a polyacrylic acid and a polymethacrylic acid, and a salt thereof.

7. The polishing liquid according to claim 1,
wherein, in a case where the polishing liquid is used for polishing silicon nitride and silicon oxide,
a ratio of a polishing speed for the silicon oxide to a polishing speed for the silicon nitride is 10 or more.

8. The polishing liquid according to claim 1, further comprising a cationic surfactant or an amphoteric surfactant.

9. The polishing liquid according to claim 8,
wherein, in a case where the polishing liquid is used for polishing silicon oxide and polysilicon,
a ratio of a polishing speed for the silicon oxide to a polishing speed for the polysilicon is 10 or more.

10. The polishing liquid according to claim 1, further comprising an anionic surfactant.

11. The polishing liquid according to claim 10,
wherein, in a case where the polishing liquid is used for polishing silicon oxide and polysilicon,
a ratio of a polishing speed for the silicon oxide to a polishing speed for the polysilicon is 0.25 to 1.5.

12. The polishing liquid according to claim 1, further comprising an anionic polymer compound,
wherein the content of the onium salt is 0.09 to 1% by mass with respect to the total mass of the polishing liquid, and
a concentration of iron ions is less than 1 ppm by mass.

13. The polishing liquid according to claim 1, further comprising an anionic polymer compound,
wherein the colloidal silica is consisting of one kind thereof,
the onium salt includes at least one selected from the group consisting of tetramethylammonium hydroxide, tetrabutylammonium hydroxide, and tetrabutylphosphonium hydroxide,
a weight-average molecular weight of the anionic polymer compound is 2,000 to 50,000,
the content of the onium salt is 0.09 to 1% by mass with respect to the total mass of the polishing liquid,
a content of the anionic polymer compound is 0.1 to 0.3% by mass with respect to the total mass of the polishing liquid,
a concentration of iron ions is less than 1 ppm by mass, and
the pH is 2 to 3.

14. A chemical mechanical polishing method comprising bringing a polishing target surface of a polishing target object into contact with a polishing pad while supplying the polishing liquid according to claim 1 to the polishing pad attached to a polishing platen, relatively moving the polishing target object and the polishing pad to polish the polishing target surface, and obtaining a polished polishing target object.

15. The chemical mechanical polishing method according to claim 14, wherein the polishing target object includes silicon nitride and silicon oxide.

16. The chemical mechanical polishing method according to claim 15, wherein the polishing target object further contains polysilicon.

* * * * *